United States Patent [19]

Shekhawat

[11] Patent Number: 5,138,202
[45] Date of Patent: Aug. 11, 1992

[54] PROPORTIONAL BASE DRIVE CIRCUIT

[75] Inventor: Sampat Shekhawat, Red Bank, N.J.

[73] Assignee: Allied-Signal Inc., Morris Township, Morris County, N.J.

[21] Appl. No.: 661,261

[22] Filed: Feb. 27, 1991

[51] Int. Cl.$^5$ ............................................. H03K 17/08
[52] U.S. Cl. ..................................... 307/570; 307/300
[58] Field of Search ....................... 307/300, 570, 253

[56] References Cited

U.S. PATENT DOCUMENTS

| | | | |
|---|---|---|---|
| 3,194,979 | 7/1965 | Toy ..................................... | 307/300 |
| 3,636,372 | 1/1972 | Hujita et al. ........................ | 307/570 |
| 3,657,572 | 4/1972 | Millman .............................. | 307/300 |
| 4,356,416 | 10/1982 | Weischedel ........................ | 307/570 |
| 4,491,744 | 1/1985 | Corey ................................. | 307/300 |
| 4,588,904 | 5/1986 | Giogolja ............................. | 307/300 |
| 4,604,535 | 8/1986 | Sasayama et al. .................. | 307/570 |
| 4,677,324 | 6/1987 | Ronan, Jr. et al. ................. | 307/300 |
| 4,970,620 | 11/1990 | Lehnhoff et al. ................... | 307/570 |

*Primary Examiner*—Eugene R. LaRoche
*Assistant Examiner*—Tan Dinh
*Attorney, Agent, or Firm*—Howard G. Massung; Robert A. Walsh

[57] ABSTRACT

A proportional base drive circuit for a power transistor. A first MOSFET, when enabled by an ON pulse, initially supplies the base drive current from a power supply to the base of the power transistor. The resulting current flow through the transistor to a load causes a proportional current to be induced in a current transformer. The induced current is supplied to the base of the power transistor through the first MOSFET. When an OFF pulse is applied, the first MOSFET is disabled and supplies no current to the base of the transistor. At the same time a second MOSFET causes the base-emitter junction of the power transistor to be negatively biased, thereby quickly switching the power transistor off.

6 Claims, 3 Drawing Sheets

PROPORTIONAL BASE DRIVE CIRCUIT

BACKGROUND OF THE INVENTION

Summary of the Invention

The present invention relates to transistor switching circuitry. More specifically, the present invention relates to circuitry for driving a high power transistor.

Brief Description of the Prior Art

High voltage bipolar power transistors have been controlled by drive circuits which include additional transistors arranged in a Darlington configuration which are connected to the base of the high voltage transistor and controlled to switch the high voltage transistor on and off. These drive circuits, however, require the generation of large drive currents. This is particularly true when high power transistors are being switched. Furthermore, the Darlington connection provides slower switching speeds. A drive circuit, therefore, which lowers power requirement of the drive current and which provides faster switching, therefore, is desirable.

SUMMARY OF THE INVENTION

A proportional power transistor base drive circuit is provided wherein a MOSFET, when enabled by a pulse, initially supplies the drive current from a power supply to the transistor base and the resulting current flow through the power transistor to the load is sensed by a current transformer whose secondary is connected to supply an induced current to the base of the power transistor through the MOSFET. When an OFF pulse is applied, the MOSFET is disabled and supplies no current to the base of the transistor and at the same time a second MOSFET causes the base-emitter junction of the transistor to be negatively biased, thereby quickly switching the power transistor OFF.

BRIEF DESCRIPTION OF THE DRAWINGS

For a better understanding of the invention reference may be had to the drawings exemplary thereof wherein.

DESCRIPTION OF THE PREFERRED EMBODIMENT

Figure 1:
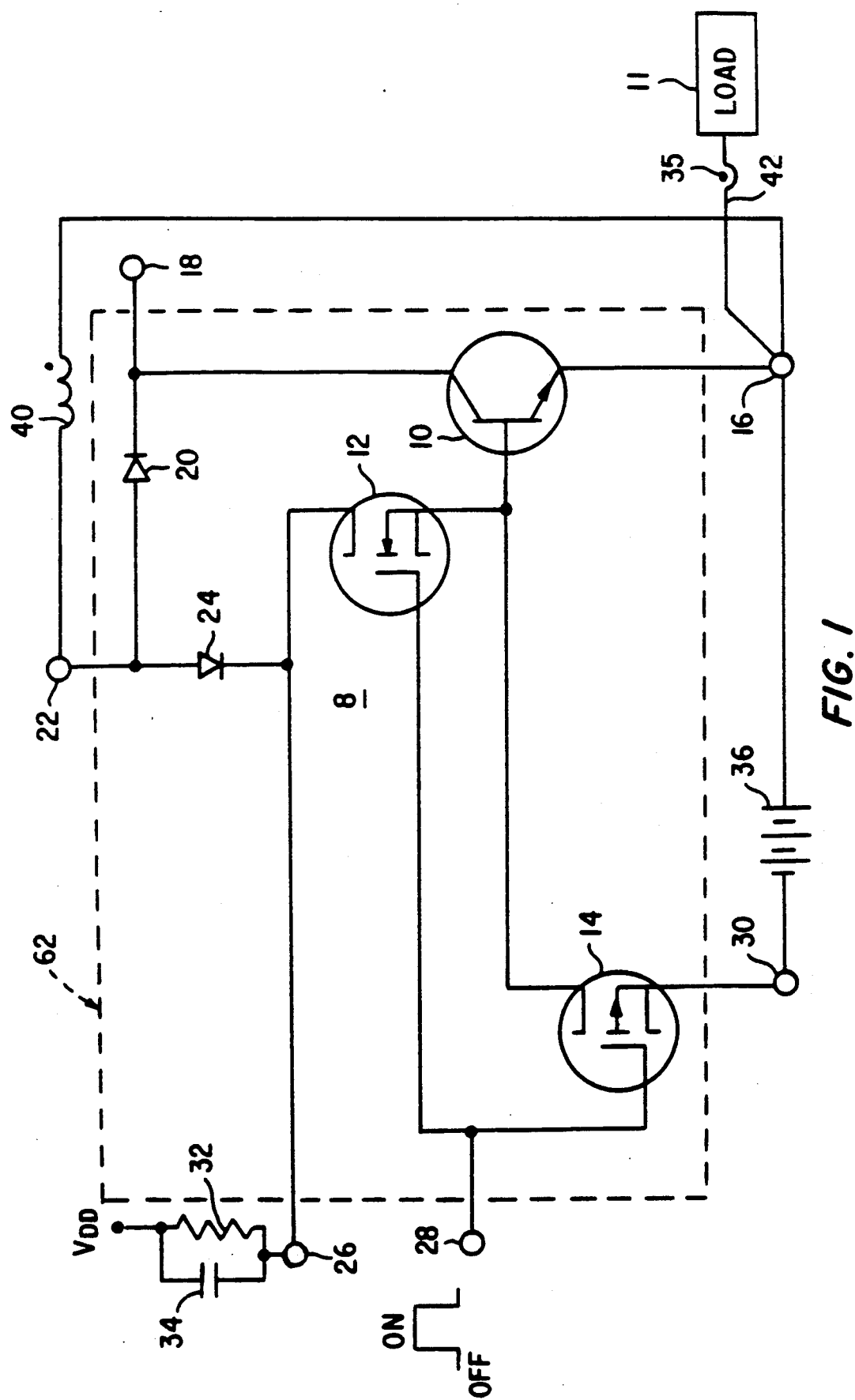
FIG. 1 illustrates a drive circuit in accordance with a preferred embodiment of the present invention.

Refer now to the drawing and FIG. 1 in particular there is illustrated a schematic diagram of a proportional base drive circuit 8 for a power transistor 10 in accordance with a preferred embodiment of the present invention. The power transistor 10 is to be switched on and off by the base drive circuit 8. The transistor 10 has a base connected to the source terminal of a MOSFET 12 and to the drain terminal of a MOSFET 14. The emitter of the transistor 10 is connected to a terminal 16. The collector of the transistor 10 is connected to a terminal 18 and to the cathode of a diode 20. The anode of the diode 20 is connected to a terminal 22 and to the anode of a diode 24. The cathode of the diode 24 is connected to a terminal 26 and to the drain terminal of the MOSFET 12. The terminal 26 is connected to a power source $V_{DD}$ through a parallel connection of a resistor 32 and a capacitor 34.

The gate terminal of MOSFET 12 is connected to a terminal 28 and to the gate terminal of the MOSFET 14. The source terminal of the MOSFET 14 is connected to a terminal 30. A voltage source 36 is connected between the terminal 30 and the terminal 16 such that the terminal 30 is negatively biased in relation to the terminal 16.

A current transformer 35, including a secondary winding 40, is connected to sense the current in wire 42 which runs from the terminal 16 to a load 11. The current transformer inductively senses the load current in the wire 42 and induces a current which is proportional to the sensed current in the secondary windings 40 of the current transformer 35. The secondary winding 40 of current transformer 35 is connected between terminals 16 and 22. The current induced in the secondary 40 is supplied to the terminal 22.

Figure 2:
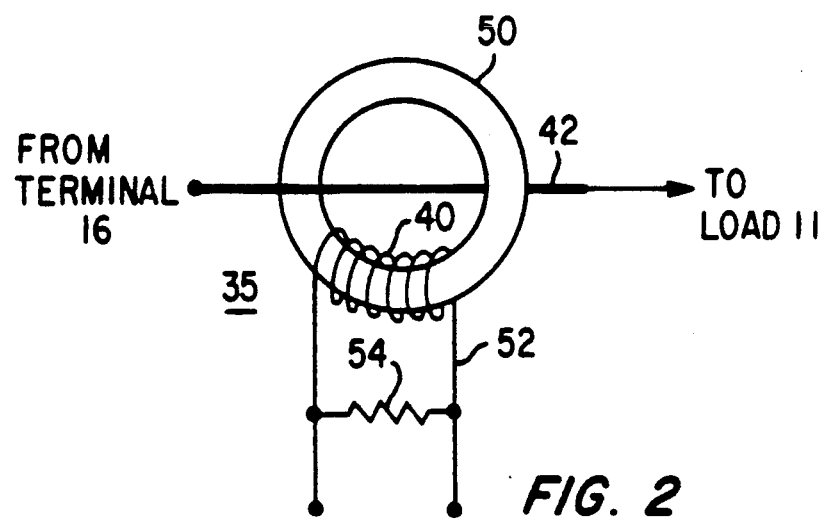
FIG. 2 illustrates a preferred current transformer.

FIG. 2 illustrates the configuration of a preferred current transformer. The wire 42 which runs between the terminal 16 and the load 11 passes through a ferromagnetic doughnut 50 and forms the primary winding of the current transformer 35. A wire is wound about the ferromagnetic doughnut 50 to form the secondary 40 of the current transformer 35. A resistor 54 is preferably provided in parallel with the winding 40. When a current flows from the terminal 16 to the load 11, a current is induced in the secondary 40 of the current transformer 35. The amount of induced current is related to the ampere turns of winding 40 in the current transformer 35 and the induced current is proportional to the current supplied to the load 11.

Referring back to FIG. 1, the operation of the proportional base drive circuit will now be explained. An OFF/ON pulse is applied to the terminal 28 to control the switching of the transistor 10. When the pulse applied to terminal 28 is OFF, i.e. at a low voltage, the MOSFET 12 is disabled so that no current flows into the base of the transistor 10. Also, the MOSFET 14 is turned on so that the base-emitter junction of the transistor 10 is negatively biased by the power supply 36, which is connected between terminals 30 and 16. The transistor 10, therefore, is turned off and conducts no current.

When the pulse applied to terminal 28 is ON, i.e. at a high voltage, the MOSFET 12 is enabled so that current is supplied from the power supply $V_{DD}$ to the base of the transistor 10 through the resistor 32, capacitor 34 and the MOSFET 12. The transistor 10, therefore, starts to conduct current. The current from the transistor 10 flows through the wire 42 to the load 11. As a result, current is induced in the secondary windings 40 of current transformer 35. The induced current in the secondary 40 is applied to the base of the transistor 10 through the terminal 22, the diode 24 and the MOSFET 12. Some of power drain from the power supply $V_{DD}$ is, therefore, relieved.

When the pulse at the terminal 28 is turned OFF, i.e. the voltage goes low, the MOSFET 12 is disabled and supplies no more current to the base of the transistor 10. At the same time, the MOSFET 14 is turned on and the negative voltage of the power supply 38 is applied to the base of the transistor 10 to quickly turn the transistor 10 off. The diode 20, diode 24 and MOSFET 12 act as an active Baker clamp for transistor 10 so transistor 10 will never conduct in saturation hence switching losses will be always less.

The circuit disclosed is particularly advantageous when switching high power transistors 10, for example, when load currents of the order of 500 amperes are supplied through the transistor 10. The reduction in drive current that must be supplied by the power supply $V_{DD}$ then becomes significant. Furthermore, the MOSFETs 12 and 14 provide for faster switching of the transistor 10 than conventional drive circuits.

Figure 3:
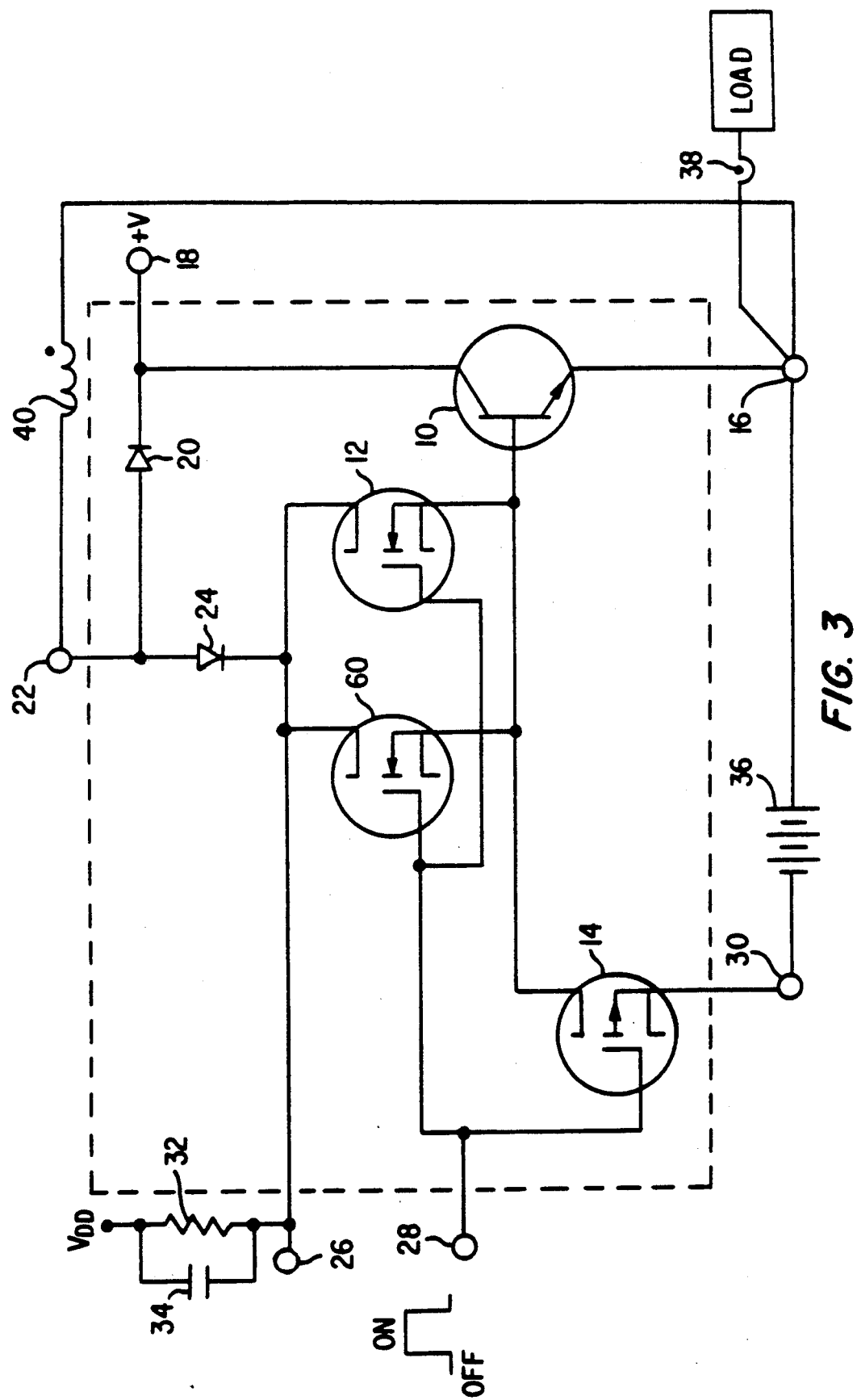
FIG. 3 illustrates a circuit in accordance with an alternate embodiment of the present invention wherein higher drive currents are required.

Referring to FIG. 3, an additional MOSFET 60 has been added to the circuit of FIG. 1. The additional MOSFET 60 is connected in parallel with MOSFET 12 and is enabled and disabled in a fashion already described with respect to the MOSFET 12. The additional MOSFET 60 is used when a single MOSFET 12 is unable to handle the current requirements necessary to switch the high power transistor 10. As many MOSFETs as are necessary can be added in this parallel fashion to supply the current needs of the power transistor 10.

Referring back to FIG. 1, a monolithic switching device 62 can be constructed as indicated. It is preferred that a die part number BT300-600 be used for the transistor 10, that a die part number SHC70N05 be used for the MOSFET 12 as well as any additional parallel MOSFETs, that a die part number IRF9140 be used for the MOSFET 14 and that die part number 40HFL60505 be used for the diodes 20 and 24. Diodes D24, D20 and power MOSFET 12 act as an active Baker clamp circuit so as to decrease the fall time of power transistor 10.

I claim:

1. A drive circuit for a power transistor having a base, an emitter and a collector for supplying power to a load, comprising:
   first switching means having a control terminal, an input terminal connected to a power supply and an output terminal connected to the base of the power transistor for providing current received at said input terminal when enabled at said control terminal;
   second switching means having a control terminal, an input terminal connected to the base of the power transistor and an output terminal connected to the emitter of the power transistor so as to negatively bias the base of said power transistor in relation to the emitter thereof when enabled at said control terminal;
   a current transformer connected to the emitter of the power transistor for sensing current flow to the load and including a secondary winding having a first end connected to said emitter and a second end;
   means connected to said second end of the secondary winding, to the collector of the power transistor and to the input terminal of the first switching means for supplying current to said input terminal which is proportional to the load current; and
   said means cooperating with the first switching means for providing active clamping means, whereby the power transistor is non-conductive in saturation so as to minimize switching losses.

2. The drive circuit as claimed in claim 1, wherein said first and second switching means are MOSFETS.

3. A drive circuit as described by claim 1, wherein the means cooperating with the first switching means includes:
   a first current flow control device connected to the second end of the secondary winding and to the input terminal of the first switching means; and
   a second current flow control device connected between the second end of the secondary winding and the first current flow control device and to the collector of the power transistor.

4. A drive circuit for a load supplying power transistor having a collector, an emitter and a base, comprising:
   a first MOSFET having a gate connected to a terminal, a drain connected to a first power supply and a source connected to the base of the power transistor;
   a second MOSFET having a gate connected to the terminal, a drain connected to the base of the power transistor and a source connected through a second power supply to the emitter of the power transistor such that the source of said second MOSFET is negatively biased in relation to the emitter of the power transistor;
   a current transformer for sensing current flow between the emitter of the power transistor and the load and including a secondary winding which is connected between the emitter and the collector of the power transistor;
   means connected to one end of the secondary winding, to the collector of the power transistor and to the first MOSFET for supplying current to said first MOSFET which is proportional to the load current; and
   said means cooperating with the first MOSFET for providing active clamping means, whereby said transistor will not conduct in saturation for minimizing switching losses.

5. A drive circuit as described by claim 4, wherein the means cooperating with the first MOSFET includes:
   a first current flow control device connected to the one end of the secondary winding and to the drain of the first MOSFET; and
   a second current flow control device connected between the one end of the secondary winding and the first current flow control device and to the collector of the power transistor.

6. A proportional base drive circuit for a power transistor having a collector, an emitter connected to a load and a base, comprising:
   a current transformer for sensing current flow between the emitter of the power transistor and the load and including a secondary coil connected in series between the emitter and a first node;
   first switching means having an input terminal connected to the first node through a first current flow control device, an output terminal connected to the base of the power transistor and a control terminal connected to a second node;
   second switching means having an input terminal connected to the output terminal of the first switching means, an output terminal connected to the emitter of the power transistor through means for negatively biasing said output terminal in relation to said emitter and an input terminal connected to the second node;
   a second current flow control device connected between the first node and the first current flow control device and to the collector of the power transistor; and
   the first and second current flow control devices and the first switching means cooperating to provide active clamping means, whereby the power transistor is non-conductive in saturation so as to minimize switching losses.

* * * * *